(12) United States Patent
Ueno et al.

(10) Patent No.: US 8,415,948 B2
(45) Date of Patent: Apr. 9, 2013

(54) CURRENT SENSOR

(75) Inventors: Hiroshi Ueno, Aichi (JP); Kouichi Itoigawa, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 325 days.

(21) Appl. No.: 12/686,289

(22) Filed: Jan. 12, 2010

(65) Prior Publication Data
US 2010/0207625 A1    Aug. 19, 2010

(30) Foreign Application Priority Data
Feb. 16, 2009   (JP) .................... 2009-032831

(51) Int. Cl.
*G01R 33/00*    (2006.01)
(52) U.S. Cl.
USPC ............... 324/260; 324/117 R; 324/117 H; 324/127; 336/178; 336/233
(58) Field of Classification Search .......... 324/117 H, 324/117 R, 126, 127, 260; 336/175, 178, 336/233
See application file for complete search history.

(56) References Cited

U.S. PATENT DOCUMENTS

| 6,686,730 B2 * | 2/2004 | Marasch et al. | 324/117 R |
| 6,859,128 B1 * | 2/2005 | Clark et al. | 336/178 |
| 7,148,675 B2 * | 12/2006 | Itoh | 324/117 R |
| 2011/0068771 A1 * | 3/2011 | Ueno et al. | 324/117 R |

FOREIGN PATENT DOCUMENTS

| JP | 64-83154 A | 3/1989 |
| JP | 07-218552 | 8/1995 |

OTHER PUBLICATIONS

Office Action dated Jun. 26, 2012 issued in corresponding JP application and partial English translation thereof.

* cited by examiner

*Primary Examiner* — Arleen M Vazquez
(74) *Attorney, Agent, or Firm* — Roberts Mlotkowski Safran & Cole P.C.

(57) ABSTRACT

A current sensor includes an annular magnetic core that includes a closed magnetic path including a void in a portion thereof, and a magnetic body for focusing flux of a magnetic field generated around a conductor that carries a measured current, and a magnetic detecting portion for detecting flux of a magnetic field generated in the void of the magnetic core. The magnetic core includes a plurality of pairs of stepped portions on a pair of opposing end surfaces that form the void, the stepped portions descending along a direction separating from the conductor.

11 Claims, 4 Drawing Sheets

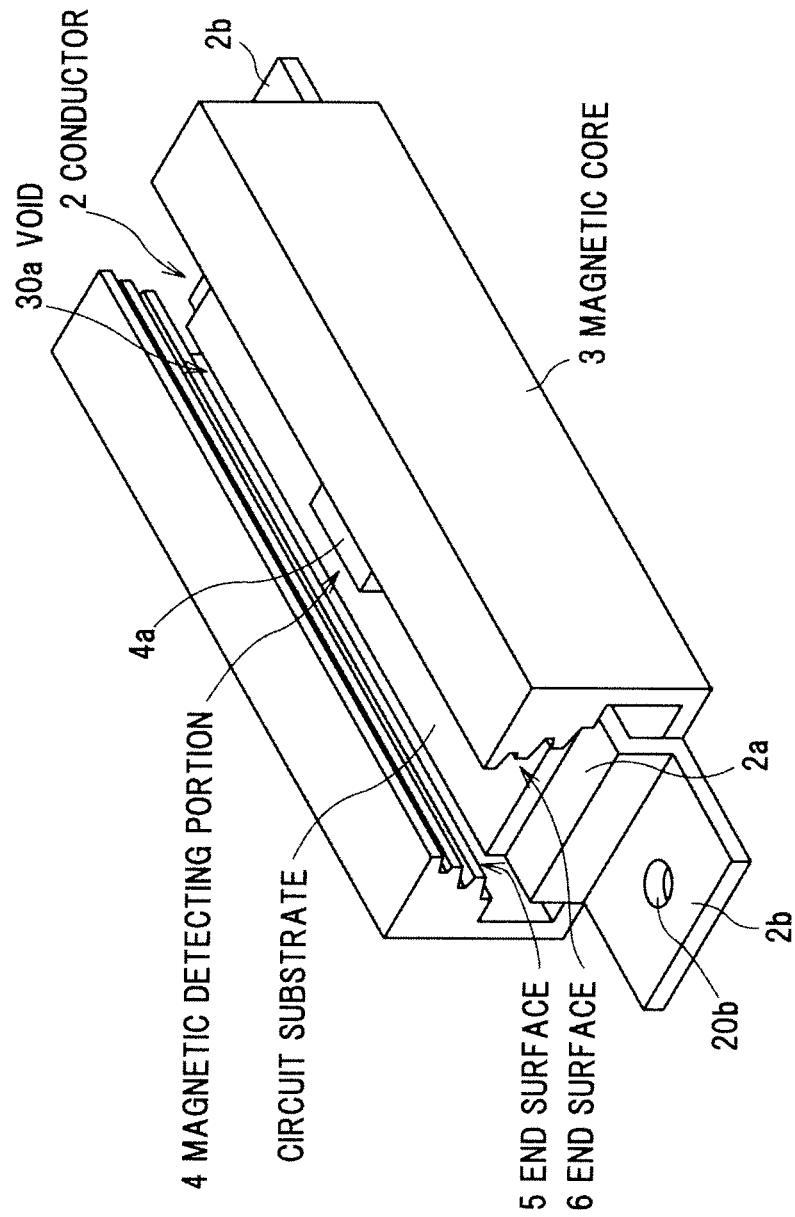

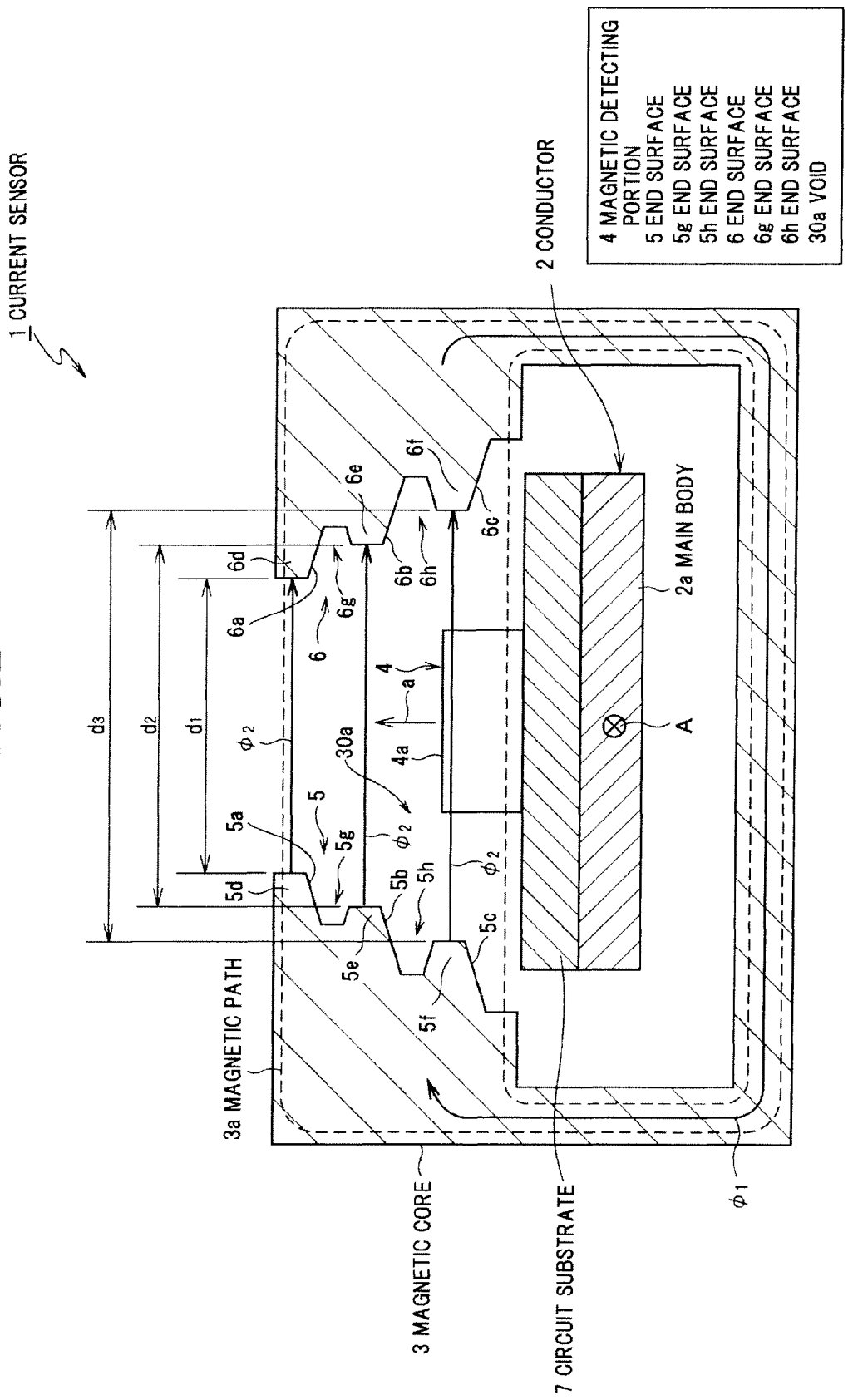

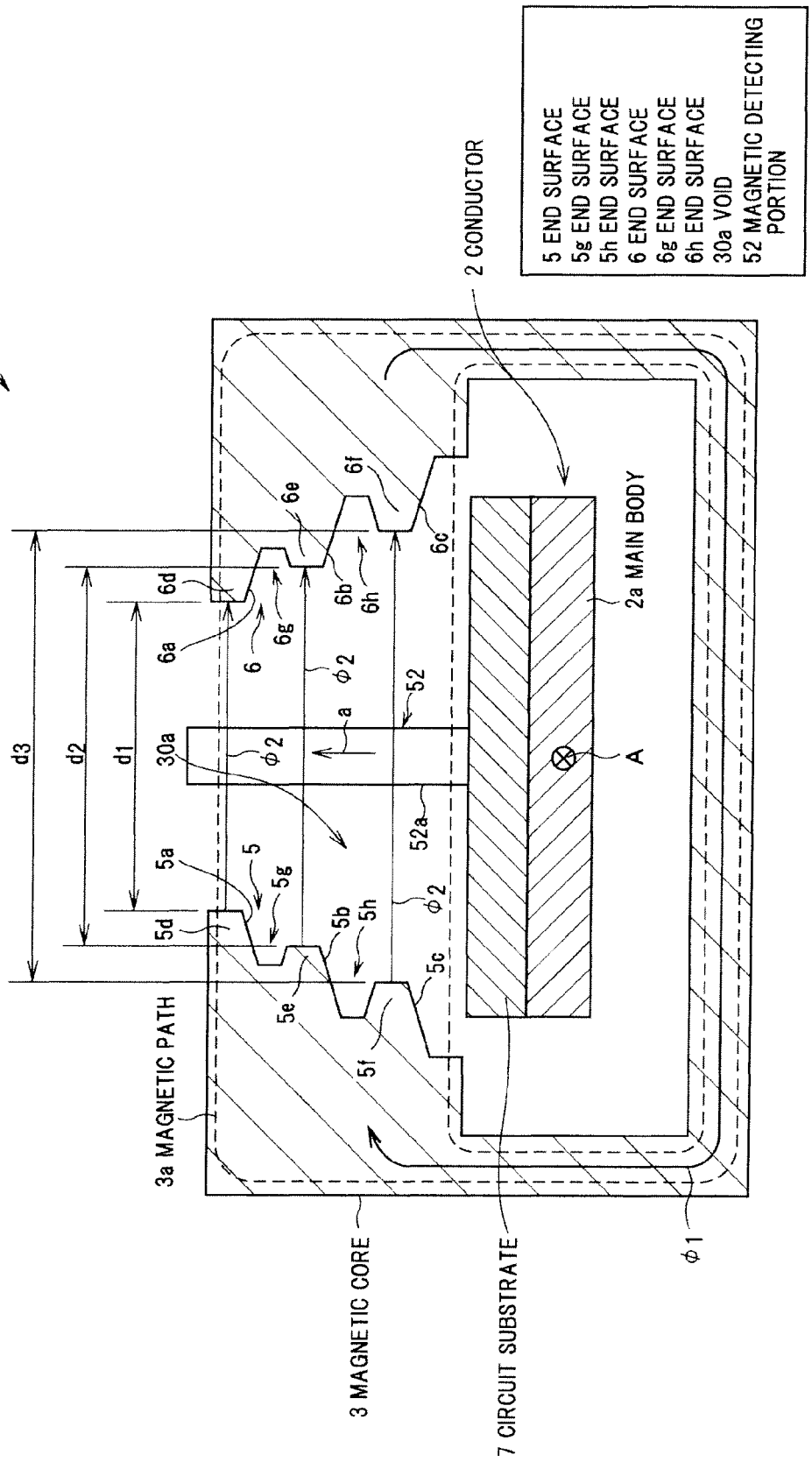

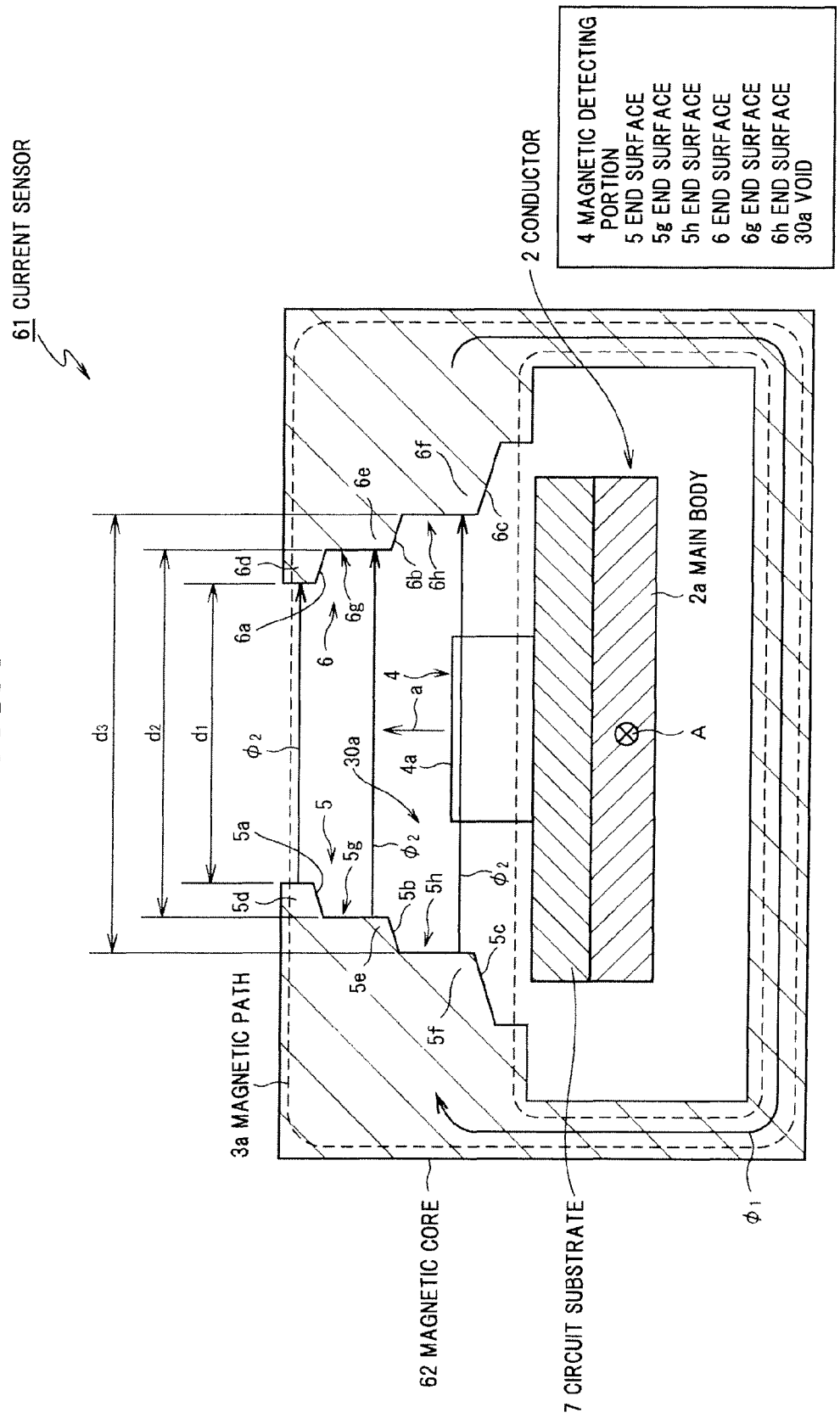

CURRENT SENSOR

The present application is based on Japanese Patent Application No. 2009-032831 filed on Feb. 16, 2009, the entire contents of which are incorporated herein by reference.

BACKGROUND OF THE INVENTION

1. Field of the Invention

The present invention relates to a current sensor, in particular, to a current sensor for measuring magnitude of a measured current which flows through a conductor.

2. Description of the Related Art

A conventional current sensor is provided with an annular magnetic core which has a closed magnetic path including a void in a portion thereof, and a magnetic detecting portion for detecting flux of a magnetic field generated in the void of the magnetic core (JP-A-64-83154).

The magnetic core is arranged around the conductor which carries the measured current, and is configured to focus the flux of the magnetic field generated by the measured current which flows through the conductor. The magnetic detecting portion is arranged inside the magnetic core, and is configured to output a detection signal corresponding to the flux of the magnetic field generated in the void of the closed magnetic path.

In such a current sensor, the flux of the magnetic field generated by flowing the measured current through the conductor is focused at the magnetic core, the flux of the magnetic field generated in the void of the magnetic core is detected at the magnetic detecting portion, and it is thereby possible to measure a flow rate (magnitude) of the measured current.

However, according to the current sensor described in JP-A-64-83154, in order to obtain uniform magnetic field distribution in the void of the magnetic core, the outside dimension of the magnetic core needs to be set large or it is necessary to arrange the magnetic detecting portion at a specific position. Thus, for the former, there are problems of not only an increase in the size of the entire sensor, but also of the high cost. On the other hand, for the latter, there is a problem that flexibility for arranging the magnetic detecting portion is decreased and it is thus difficult to mount the sensor.

SUMMARY OF THE INVENTION

Therefore, it is an object of the invention to provide a current sensor which allows to downsize the entire sensor, to reduce the cost and to simplify mounting of the sensor.

(1) According to one embodiment of the invention, a current sensor comprises:

an annular magnetic core that comprises a closed magnetic path including a void in a portion thereof, and a magnetic body for focusing flux of a magnetic field generated around a conductor that carries a measured current; and a magnetic detecting portion for detecting flux of a magnetic field generated in the void of the magnetic core, wherein the magnetic core comprises a plurality of pairs of stepped portions on a pair of opposing end surfaces that form the void, the stepped portions descending along a direction separating from the conductor.

In the above embodiment (1), the following modifications and changes can be made.

(i) An end surface between adjacent two stepped portions among the plurality of pairs of stepped portions comprises a concavity that opens to the void.

(ii) The concavity is gradually widened from a bottom portion toward an opening portion.

(iii) The plurality of pairs of stepped portions each comprise an inclined surface having a slope that descends along a direction separating from the conductor.

(iv) The magnetic detecting portion comprises a detecting surface orthogonal to a direction of the magnetic field generated in the void.

(v) The magnetic detecting portion comprises a Hall element or a GMR element.

(2) According to another embodiment of the invention, a current sensor comprises:

an annular magnetic core that comprises a closed magnetic path including a void in a portion thereof, and a magnetic body for focusing flux of a magnetic field generated around a conductor that carries a measured current; and a magnetic detecting portion for detecting flux of a magnetic field generated in the void of the magnetic core, wherein the magnetic core comprises a pair of opposing end surfaces that form the void;

the pair of opposing end surfaces comprises a plurality of opposing surfaces parallel to each other; and a distance between the plurality of opposing surfaces is narrowed stepwise along a direction separating from the conductor.

In the above embodiment (2), the following modifications and changes can be made.

(vi) Strength of a magnetic field generated between the plurality of opposing surfaces is substantially uniform in a plurality of closed magnetic paths formed along the direction separating from the conductor.

(vii) The plurality of opposing surfaces each comprise a top surface of a plurality of convex portions formed on the end surfaces.

(viii) Adjacent two convex portions of the plurality of convex portions are formed so as to sandwich a concave portion having a bottom surface.

Points of the Invention

According to one embodiment of the invention, a current sensor is constructed such that a pair of end surfaces of an annular magnetic core form a void, and the distance between the end surfaces is gradually narrowed along a direction being away from a conductor to enclosed in the annular magnetic core, while strength of magnetic filed decreases along that direction. Thus, strength of a magnetic field generated between the opposing end surfaces can be substantially uniform in plural closed magnetic paths formed along the direction separating from the conductor. Uniform magnetic field distribution can be obtained in the void of the magnetic core, so that it is possible to reduce dispersion of output (i.e., measured current) caused by dispersion of mounting position of a magnetic detecting portion.

BRIEF DESCRIPTION OF THE DRAWINGS

Next, the present invention will be explained in more detail in conjunction with appended drawings, wherein:

FIG. 1 is an explanatory perspective view showing a current sensor in a first preferred embodiment of the present invention;

FIG. 2 is an explanatory cross sectional view showing the current sensor in the first embodiment of the invention;

FIG. 3 is an explanatory cross sectional view showing a current sensor in a second embodiment of the invention; and FIG. 4 is an explanatory cross sectional view showing a current sensor in a third embodiment of the invention.

DESCRIPTION OF THE PREFERRED EMBODIMENTS

First Embodiment

FIG. 1 shows a current sensor in the first embodiment.
Entire Structure of Current Sensor In FIG. 1, a current sensor 1 is schematically configured by a magnetic core 3 for focusing flux $\phi_1$ of a magnetic field generated around a conductor 2 which carries a measured current A (shown in FIG. 2), and a magnetic detecting portion 4 for detecting flux $\phi_2$ of the magnetic field (magnetic flux density) generated in a void 30a of the magnetic core 3.

Structure of Magnetic Core 3

As shown in FIG. 2, the magnetic core 3 has a closed magnetic path 3a including the void 30a in a portion thereof, is arranged around the conductor 2, and is entirely formed by a ferromagnetic body having a C-shaped cross section (an annular shape) formed of, e.g., a soft magnetic material such as ferrite. The inside of the magnetic core 3 is sealed by, e.g., a resin package such as nylon resin. In addition, the magnetic core 3 has a pair of end surfaces 5 and 6 which form the void 30a, and the dimension thereof is determined so that the distance between the end surfaces 5 and 6 is gradually narrowed along a direction separating from the conductor 2 (i.e., a direction of arrow a in FIG. 2).

On the end surfaces 5 and 6, plural pairs (three pairs in the present embodiment) of stepped portions 5a-5c and 6a-6c which descend along the direction of arrow a, and plural pairs (three pairs in the present embodiment) of convex portions 5d-5f and 6d-6f for forming the stepped portions 5a-5c and 6a-6c are symmetrically provided.

A void size $d_1$ between the convex portions 5d and 6d is set smaller than a void size $d_2$ between the convex portions 5e and 6e ($d_1 < d_2$), and the void size $d_2$ between the convex portions 5e and 6e is set smaller than a void size $d_3$ between the convex portions 5f and 6f ($d_2 < d_3$), respectively. As a result, a strength $H_1$ of a magnetic field generated between the convex portions 5d and 6d, a strength $H_2$ of a magnetic field generated between the convex portions 5e and 6e and a strength $H_3$ of a magnetic field generated between convex portions 5f and 6f become substantially the same ($H_1 \approx H_2 \approx H_3$). In other words, the void sizes $d_1$, $d_2$ and $d_3$ are determined so that the magnetic field strengths $H_1$, $H_2$ and $H_3$ become $H_1 \approx H_2 \approx H_3$. Therefore, in the void 30a between the both end surfaces 5 and 6, the flux $\Phi_2$ of the magnetic field generated by the measured current A passes along the closed magnetic path 3a and a substantially uniform magnetic flux density B is obtained.

End surfaces 5g, 5h, 6g and 6h between two adjacent stepped portions among the stepped portions 5a-5c and 6a-6c open to the void 30a, and are formed by a concavity which is gradually widened from a bottom portion toward an opening portion. As a result, the substantially uniform magnetic flux density of the magnetic field generated in the void 30a of the magnetic core 3 is more effectively obtained.

The end surface 5g is arranged between both the stepped portions 5a and 5b and the end surface 5h is arranged between both the stepped portions 5b and 5c, respectively. The end surface 6g is arranged between both the stepped portions 6a and 6b and the end surface 6h is arranged between both the stepped portions 6b and 6c, respectively.

The conductor 2 has a main body 2a and attaching portions 2b, 2b (shown in FIG. 1), is arranged penetrating the magnetic core 3, is electrically/mechanically attached to a circuit substrate (not shown) via the attaching portions 2b, 2b, and is entirely formed by a bus bar which is formed of a metal material such as, e.g., copper or phosphor bronze. In addition, in FIG. 2, the conductor 2 is configured to flow the measured current A from an upper side of the paper toward the reverse side thereof so as to generate the magnetic field in a right-handed screw direction with respect to the flow direction.

The main body 2a is arranged at a center portion of the conductor 2, is housed in the magnetic core 3, and is entirely formed by a U-shaped cross-section body.

The attaching portions 2b, 2b are arranged at both ends of the conductor 2, and are integrally formed with the main body 2a. The attaching portions 2b, 2b are provided with screw insertion holes 20b, 20b for inserting screws (not shown) for electrically/mechanically attaching the conductor 2 to the circuit substrate.

Structure of Magnetic Detecting Portion 4

The magnetic detecting portion 4 has a detecting surface 4a parallel to a direction of the magnetic field generated in the void 30a, is mounted on a circuit substrate 7 so that a portion including the detecting surface 4a faces the void 30a, and is connected to a non-illustrated ECU (Electronic Control Unit). In addition, the magnetic detecting portion 4 is configured so as to detect the flux $\phi_2$ of the magnetic field generated in the void 30a and to output the detection signal to the ECU. For example, a Hall IC (Integrated Circuit) or a GMR (Giant Magneto Resistance Effect) element is used as the magnetic detecting portion 4.

Motion of Current Sensor 1

Motion of the current sensor 1 in the present embodiment will be explained hereinafter.

In the current sensor 1, it is possible to focus the flux $\phi_1$ of the magnetic field generated by flowing the measured current A through the conductor 2, and to detect the flux $\phi_2$ of the magnetic field generated in the void 30a of the magnetic core 3 at the magnetic detecting portion 4, thereby measuring the magnitude of the measured current A.

In this case, the flux $\phi_1$ of the magnetic field generated around the conductor 2 by the measured current A passes the magnetic core 3 and the flux $\phi_2$ passes the void 30a, each along the closed magnetic path 3a. At this time, in the void 30a of the closed magnetic path 3a, the flux $\phi_2$ is leaked from each of the convex portions 5d-5f and reach the convex portions 6d-6f. Then, the magnetic detecting portion 4 detects the flux $\phi_2$ and outputs the detection signal to the ECU. At the ECU, the detection signal from the magnetic detecting portion 4 is input and the magnitude of the measured current A is measured based on the detection signal.

Effects of the First Embodiment

According to the above-mentioned first embodiment, the following effects are obtained.

(1) Since uniform magnetic field distribution can be obtained in the void 30a of the magnetic core 3, it is possible to reduce dispersion of output caused by dispersion of mounting position of the magnetic detecting portion 4.

(2) Since, unlike the conventional art, the outside dimension of the magnetic core 3 does not need to be set large, it is possible to downsize the entire sensor and to reduce the cost.

(3) Since, unlike the conventional art, it is not necessary to arrange the magnetic detecting portion 4 at a specific position, it is possible to increase the flexibility for arranging the magnetic detecting portion 4, and thereby possible to simplify the mounting of the sensor.

Second Embodiment

FIG. 3 shows a current sensor in the second embodiment. In FIG. 3, the same reference numerals are assigned to the same or equivalent members as in FIG. 2, and the detailed explanations will be omitted.

As shown in FIG. 3, a current sensor 51 shown in the second embodiment is characterized in that a magnetic detecting portion 52 has a detecting surface 52a such as to be orthogonal to a direction of the magnetic field generated in the void 30a.

Thus, the magnetic detecting portion 52 is mounted on the circuit substrate 7 penetrating the void 30a, and is also connected to the ECU. For example, a Hall IC or a GMR element is used as the magnetic detecting portion 52.

Effects of the Second Embodiment

According to the above-explained second embodiment, the same effects as that of the first embodiment are obtained.

Third Embodiment

FIG. 4 shows a current sensor in the third embodiment. In FIG. 4, the same reference numerals are assigned to the same or equivalent members as in FIG. 2, and the detailed explanations will be omitted.

As shown in FIG. 4, a current sensor 61 shown in the third embodiment is different from the current sensors 1 and 51 respectively shown in the first and second embodiments in that the end surfaces 5g, 5h, 6g and 6h between two adjacent stepped portions among the plural pairs of stepped portions 5a-5c and 6a-6c are not formed by a concavity.

In a magnetic core 62 of the current sensor 61, plural pairs of stepped portions 5a-5c and 6a-6c are each formed by an inclined surface having a slope which descends along a direction separating from the conductor 2.

Effects of the Third Embodiment

According to the above-explained third embodiment, the same effects as that of the first embodiment are obtained.

Although the current sensor according to the present invention has been described based on the above preferred embodiments, the invention is not to be limited by the above preferred embodiments and it is possible to implement in various features without going beyond a scope of the concept. For example, following variations can be made.

(1) In each embodiment, although it is explained that the magnetic core 3 is ferrite, the present invention is not limited thereto. Hence, other soft magnetic material having small residual flux density such as permalloy or silicon steel plate may be used.

(2) In each embodiment, although the three pairs of stepped portions 5a-5c and 6a-6c are explained, the present invention is not limited thereto. Hence, the number of pairs can be, of course, appropriately changed depending on the intended use, etc.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A current sensor, comprising:
an annular magnetic core that comprises a closed magnetic path including a flux sensing void in a portion thereof and a magnetic body for focusing flux of a magnetic field generated around a conductor that carries a measured current; and
a magnetic detecting portion for detecting flux of a magnetic field generated in the void of the magnetic core,
wherein the magnetic core includes, in a cross sectional view orthogonal to the conductor, a plurality of pairs of stepped portions on a pair of opposing end portions that form the flux sensing void, each stepped portion protrudes from its respective end portion toward the opposing end portion, and distances between end surfaces of directly opposing stepped portions sequentially decrease for all of the stepped portions along a direction extending away from the conductor in the cross sectional view, and
wherein an end surface between two adjacent stepped portions among the plurality of pairs of stepped portions comprises a concavity that opens to the void.

2. The current sensor according to claim 1, wherein each concavity gradually widens from a bottom portion toward an opening portion.

3. The current sensor according to claim 1, wherein the magnetic detecting portion comprises a detecting surface orthogonal to a direction of the magnetic field generated in the void.

4. The current sensor according to claim 1, wherein the magnetic detecting portion comprises a Hall element or a GMR element.

5. The current sensor according to claim 1, wherein the end surfaces of the opposing step portions are symmetrically arranged such that each end surface is parallel with and has a same length in a direction toward the center of the magnetic core as an opposing end surface.

6. A current sensor, comprising:
an annular magnetic core that comprises a closed magnetic path including a flux sensing void in a portion thereof and a magnetic body for focusing flux of a magnetic field generated around a conductor that carries a measured current; and
a magnetic detecting portion for detecting flux of a magnetic field generated in the void of the magnetic core,
wherein the magnetic core includes, in a cross sectional view orthogonal to the conductor, a plurality of pairs of stepped portions on a pair of opposing end portions that form the flux sensing void, each stepped portion protrudes from its respective end portion toward the opposing end portion, and distances between end surfaces of directly opposing
stepped portions sequentially decrease for all of the stepped portions along a direction extending away from the conductor in the cross sectional view, and
wherein the plurality of pairs of stepped portions each further include an inclined surface having a slope that descends along a direction extending away from the conductor.

7. The current sensor according to claim 6, wherein the inclined surface connects the end surfaces of two adjacent stepped portions.

8. The current sensor according to claim 6, wherein all of the inclined surfaces have a slope that descends along a direction extending away from the conductor.

9. A current sensor, comprising:
an annular magnetic core that comprises a closed magnetic path including a flux sensing void in a portion thereof and a magnetic body for focusing flux of a magnetic field generated around a conductor that carries a measured current; and
a magnetic detecting portion for detecting flux of a magnetic field generated in the void of the magnetic core,
wherein the magnetic core includes a pair of opposing end portions that define the flux sensing void, the pair of opposing end portions having, in a cross sectional view orthogonal to the conductor, a plurality of directly opposing stepped surfaces parallel to each other, and wherein each stepped surface protrudes from its respective end portion toward the opposing end portion, and a distance between all of the plurality of directly opposing stepped surfaces is sequentially narrowed stepwise along a direction extending away from the conductor for all of the opposing stepped surfaces in the cross sectional view, and wherein the plurality of opposing stepped surfaces each comprise a top surface of a plurality of convex portions formed on the opposing end portions.

10. The current sensor according to claim 9, wherein adjacent two convex portions of the plurality of convex portions are formed so as to sandwich a concave portion having a bottom surface.

11. The current sensor according to claim 9, wherein the opposing end surfaces of the stepped portions are symmetrically arranged such that each end surface is parallel with and has a same length in a direction toward the center of the magnetic core as an opposing end surface.

* * * * *